United States Patent
Jin et al.

(10) Patent No.: US 12,279,413 B2
(45) Date of Patent: Apr. 15, 2025

(54) CAPACITOR FOR DYNAMIC RANDOM ACCESS MEMORY, DRAM INCLUDING THE SAME AND METHODS OF FABRICATING THEREOF

(71) Applicants: SK hynix Inc., Icheon (KR); Korea Advanced Institute of Science and Technology, Daejeon (KR)

(72) Inventors: Hyunsoo Jin, Anyang (KR); Byung Jin Cho, Daejeon (KR); Seongho Kim, Daejeon (KR)

(73) Assignees: SK hynix Inc., Icheon (KR); Korea Advanced Institute of Science and Technology, Daejeon (KR)

( * ) Notice: Subject to any disclaimer, the term of this patent is extended or adjusted under 35 U.S.C. 154(b) by 620 days.

(21) Appl. No.: 17/591,381

(22) Filed: Feb. 2, 2022

(65) Prior Publication Data
US 2022/0246716 A1    Aug. 4, 2022

(30) Foreign Application Priority Data
Feb. 3, 2021  (KR) .................. 10-2021-0015715

(51) Int. Cl.
*H10B 12/00*   (2023.01)
*H01G 4/10*    (2006.01)
*H10D 1/68*    (2025.01)

(52) U.S. Cl.
CPC .............. *H10B 12/30* (2023.02); *H01G 4/10* (2013.01); *H10B 12/03* (2023.02); *H10D 1/692* (2025.01)

(58) Field of Classification Search
CPC ..... H01G 4/10; H01L 21/02194; H01L 28/40; H01L 28/60; H10B 12/03; H10B 12/30
See application file for complete search history.

(56) References Cited

U.S. PATENT DOCUMENTS

| | | | |
|---|---|---|---|
| 2004/0012938 A1* | 1/2004 | Sylvester | H01L 21/4857 257/E23.079 |
| 2019/0148390 A1 | 5/2019 | Frank | |
| 2020/0035493 A1* | 1/2020 | Clark | C23C 16/45553 |
| 2020/0058658 A1* | 2/2020 | Heo | H01L 29/6684 |
| 2020/0126995 A1* | 4/2020 | Ge | H10B 12/05 |

FOREIGN PATENT DOCUMENTS

KR    10-2016-0038631 A    4/2016

* cited by examiner

*Primary Examiner* — Michelle Mandala
*Assistant Examiner* — Kevin Quinto

(57) ABSTRACT

Disclosed are a capacitor for DRAM, a DRAM including the same, and a method of fabricating the same. The DRAM capacitor according to an embodiment may include a first electrode of the DRAM; a second electrode spaced apart from the first electrode; and a dielectric layer including a HfZrO film disposed between the first electrode and the second electrode. The HfZrO film may have an intermediate state corresponding to a phase transition region between a first state in which a tetragonal crystalline phase with anti-ferroelectricity property or a tetragonal crystalline phase is dominant, and a second state in which the orthorhombic crystalline phase with anti-ferroelectricity property or the orthorhombic crystalline phase is dominant. The HfZrO film may include both of the tetragonal crystalline phase and the orthorhombic crystalline phase. The HfZrO film maintains an intermediate state corresponding to the phase transition region within the operating voltage range of the capacitor.

18 Claims, 16 Drawing Sheets

CAPACITOR FOR DYNAMIC RANDOM ACCESS MEMORY, DRAM INCLUDING THE SAME AND METHODS OF FABRICATING THEREOF

CROSS-REFERENCES TO RELATED APPLICATION

The present application claims, under 35 U.S.C. § 119(a), the benefit of Korean application No. 10-2021-0015715, filed on Feb. 3, 2021, which is herein incorporated by reference in its entirety.

BACKGROUND OF THE INVENTION

1. Field

The present disclosure relates to electronic device and method of fabricating the same, and more particularly, to a capacitor, a volatile memory device including the same, and method of fabricating the same.

2. Description of the Related Art

Recently, the scale reduction of large scale integrated circuits (LSIs) has been accelerated due to the development of semiconductor fabricating process technology. In particular, in the case of memory devices, as design rules continue to decrease, a memory cell size of 30 nm or less is required.

Even in the case of a dynamic random access memory (DRAM), which is a typical semiconductor device, an area occupied by a capacitor which is an information storage device of a memory cell is gradually reduced for scaling down. However, in spite of the reduced area of the capacitor, a predetermined capacitance must be maintained to secure an operating margin, and various technologies have been proposed for this purpose. For example, the approaches to reduce the thickness of the dielectric to maintain capacitance are possible. However, in this case, there is a problem in that the leakage current increases due to the electric field applied to the dielectric. In order to reduce the leakage current, research is being conducted to replace the conventional dielectric material (a silicon oxide film) with a high-k material that may implement an equivalent oxide film with a thick and thin physical thickness and also has a large bandgap.

As the high dielectric constant material, a dielectric material such as a single film structure such as hafnium oxide, zirconium oxide and $SrTiO_3$ film or a composite oxide film such as $ZrO_2/Al_2O_3/ZrO_2$ has been proposed. Potential dielectric candidate materials for the realization of next-generation DRAM capacitors are required.

SUMMARY OF THE INVENTION

A technological object of the present disclosure is to provide a capacitor for DRAM including a dielectric layer that has a high dielectric constant, may realize a thin equivalent oxide thickness EOT, and may suppress or minimize leakage current problems.

Furthermore, a technological object of the present disclosure is to provide a method capable of fabricating the above-described capacitor for DRAM by applying an electrical signal.

Furthermore, a technological object of the present disclosure is to provide a DRAM device to which the above-described DRAM capacitor is applied and a method for fabricating the same.

The objects to be solved by the present disclosure are not limited to the objects mentioned above, and other objects not mentioned will be understood by those skilled in the art from the following description.

According to one example of the present disclosure, there is provided a capacitor for DRAM comprising a first electrode, a second electrode spaced apart from the first electrode, and a dielectric layer including a hafnium-zirconium oxide film (HfZrO film) disposed between the first electrode and the second electrode, wherein the HfZrO film has an intermediate state corresponding to a phase transition region between a first state of a tetragonal crystalline phase having semi-ferroelectricity and a second state of an orthorhombic crystalline phase having ferroelectricity and includes both of the tetragonal crystal phase and the orthorhombic crystal phase, and the HfZrO film maintains the intermediate state corresponding to the phase transition region within the operating voltage range of the capacitor.

In an initial state in which no voltage is applied between the first electrode and the second electrode, the HfZrO film may have a first intermediate state corresponding to the phase transition region. When a first operating voltage is applied between the first electrode and the second electrode to charge the capacitor, the HfZrO film may have a second intermediate state corresponding to the phase transition region. The content of the orthorhombic crystalline phase of the second intermediate state may be higher than the content of the orthorhombic crystalline phase of the first intermediate state.

After a first operating voltage greater than 0 V is applied between the first electrode and the second electrode, and when a voltage of 0 V is applied between the first electrode and the second electrode, the HfZrO film may have a remnant polarization is about 0. In an embodiment, after the capacitor is used at its operating voltage, the remnant polarization of the HfZrO film is 0.

The operating voltage range of the capacitor may be in the range of about −3 to 3 V or in the range of −1.2 V to 1.2 V. The HfZrO film may have a composition of $Hf_xZr_{1-x}O_2$, in which $0<x<1$.

The HfZrO film may have a thickness in the range of about 1 to 10 nm, and may be reduced to 5 nm or less.

The HfZrO film may have a dielectric constant of about 50 or more.

The HfZrO film may have an equivalent oxide thickness EOT of about 0.5 nm or less or 0.4 nm or less.

According to another example of the present disclosure, there is provided a DRAM including the above-described capacitor.

According to another example of the present disclosure, there is provided a method of fabricating a capacitor for DRAM, comprising a step for forming a first electrode of DRAM; a step for forming a dielectric layer having an HfZrO film on the first electrode; a step for forming a second electrode on the dielectric layer; and a step for changing the HfZrO film into an intermediate state corresponding to a phase transition region between a first state in which a tetragonal crystalline phase having anti-ferroelectricity is dominant and a second state in which an orthorhombic crystalline phase having ferroelectricity is dominant; and wherein in the intermediate state, the HfZrO film includes both of the tetragonal crystalline phase and the orthorhombic crystalline phase, and the HfZrO film maintains an intermediate state corresponding to the phase transition region within the operating voltage range of the capacitor.

The electrical signal may have an electric field signal strength of about −3 to 3 MV/cm or −1.2 to 1.2 MV/cm. The electrical signal may be a pulse voltage signal having a duration of 1000 μs or less.

When the electrical signal is repeatedly applied, an interval between the pulse voltage signals may be up to 1000 μs.

When the electrical signal is repeatedly applied, the number of cycles of the electrical signal may be in the range of about $10^3$ to $10^9$.

The operating voltage range of the capacitor may be in the range of about −3 to 3 V or in the range of −1.2 V to 1.2 V or 1.5 V to 1.5 V. The HfZrO film may have a composition of $Hf_xZr_{1-x}O_2$, in which 0<x<1.

The HfZrO film may have a thickness in the range of about 1 to 10 nm.

After changing the state of the HfZrO film into the intermediate state, the HfZrO film may have a dielectric constant of about 50 or more, and the HfZrO film may have an equivalent oxide thickness EOT of about 0.5 nm or less.

According to another example of the present disclosure, there is provided a method of fabricating a DRAM including a switching element and a capacitor electrically connected to the switching element, and the method comprising a step for fabricating the capacitor by using the above-described method.

According to embodiments of the present disclosure, it is possible to realize a capacitor for DRAM including a dielectric layer capable of realizing a high dielectric constant, a thin equivalent oxide thickness (EOT), and suppressing or minimizing a leakage current problem. In addition, according to embodiments of the present disclosure, the above-described capacitor for DRAM may be easily manufactured by applying an electrical signal without problems such as deterioration of characteristics.

It is possible to implement a DRAM having a small memory cell size and excellent operating characteristics by applying the capacitor according to the example of the present disclosure.

DETAILED DESCRIPTION OF THE INVENTION

Figure 1:
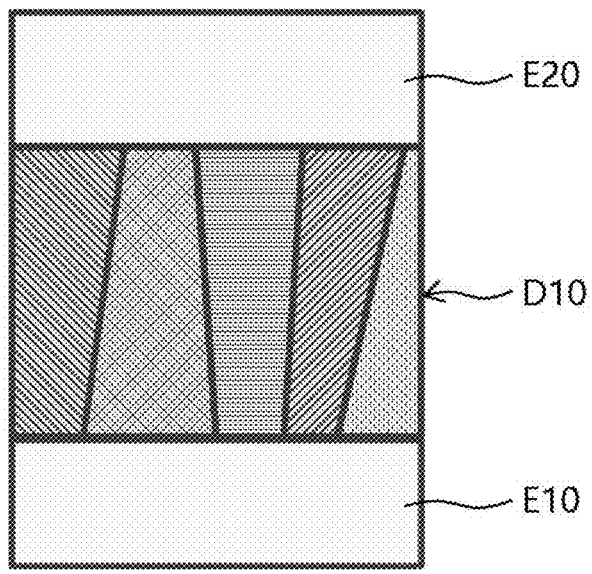
FIG. 1 is a cross-sectional view illustrating a capacitor for dynamic random access memory (DRAM) according to an example of the present disclosure.

Hereinafter, the embodiments of the present disclosure will be described in detail with reference to the accompanying drawings.

The embodiments of the present disclosure to be described below are provided to more clearly explain the present disclosure to those of ordinary skill in the related art, and the scope of the present disclosure is not limited by the following embodiments, and the following embodiments may be modified in many different forms.

The terminology used herein is used to describe the specific embodiments, and is not used to limit the present disclosure. As used herein, terms in the singular form may include the plural form unless the context clearly dictates otherwise. Also, as used herein, the terms "comprise" and/or "comprising" specifies presence of the stated shape, step, number, action, member, element and/or group thereof; and does not exclude presence or addition of one or more other shapes, steps, numbers, actions, members, elements, and/or groups thereof. In addition, the term "connection" as used herein is a concept that includes not only that certain members are directly connected, but also a concept that other members are further interposed between the members to be indirectly connected.

In addition, in the present specification, when a member is said to be located "on" another member, this includes not only a case in which a member is in contact with another member but also a case in which another member is present between the two members. As used herein, the term "and/or"

includes any one and any combination of one or more of those listed items. In addition, as used herein, terms such as "about", "substantially", etc. are used as a range of the numerical value or degree, in consideration of inherent fabricating and material tolerances and variation and measurement error. Furthermore, accurate or absolute numbers provided to aid the understanding of the present application are used to prevent an infringer from using the disclosed present disclosure unfairly.

Hereinafter, embodiments of the present disclosure will be described in detail with reference to the accompanying drawings. The size or thickness of the regions or parts shown in the accompanying drawings may be slightly exaggerated for clarity and convenience of description. The same reference numerals refer to the same elements throughout the detailed description.

FIG. 1 is a cross-sectional view illustrating a capacitor for dynamic random access memory (DRAM) according to an example of the present disclosure.

Referring to FIG. 1, a DRAM capacitor according to an example of the present disclosure may include a first electrode E10, a second electrode E20 spaced apart from the first electrode E20, and a dielectric layer D10 including a hafnium zirconium oxide film HfZrO film disposed between the first electrode E10 and the second electrode E20. The first dielectric layer D10 may be formed of an HfZrO layer. The shape of the first electrode E10 and the second electrode E20 is not limited to the illustrated flat plate configuration, and the electrodes may any shape in which the dielectric layer D10 is coupled between the first electrode E10 and the second electrode E20. In some embodiments, as a non-limiting example, the electrodes may have a three-dimensional shape in which an electrode covers the other electrode, such as a three-dimensional cylinder structure, a double-sided cup structure, or a column structure.

In one embodiment, the HfZrO film may have an 'intermediate region' corresponding to a phase transition region between a first state of a tetragonal crystalline phase with anti-ferroelectricity and a second state of an orthorhombic crystalline phase with ferroelectricity. In an embodiment, the phase transition region is an intermediate region in a process of transitioning from the first state to the second state. In addition, the first state refers not only to the polycrystalline or monocrystalline forms of the complete tetragonal crystalline phase entirely in the HfZrO film, but also to a dominant state of the tetragonal crystalline phase in which an amount of about 90 vol % or more or about 95 vol % or more of the HfZrO film is tetragonal crystals. Similarly, the second state refers not only to the polycrystalline or monocrystalline forms of the complete orthorhombic crystalline phase entirely in the HfZrO film, but also to a dominant state of the tetragonal crystalline phase in which an amount of about 90 vol % or more or about 95 vol % or more of the HfZrO film is orthorhombic crystals. In the second state, the occupancy ratio of the corresponding crystalline phase across the total volume of the thin film may be calculated through a cross-section or surface area ratio or crystallinity analysis using X-rays. In an embodiment, up to 90% of the HfZrO film is in a tetragonal crystalline phase, and up to 90% of the HfZrO film is in an orthorhombic crystalline phase, so that both the tetragonal crystalline phase and the orthorhombic crystalline phase are present within in a range of 10 to 90%.

In the present disclosure, the phase transition region may be referred to as a morphological phase boundary (MPB). Therefore, the HfZrO film may include both the tetragonal crystalline phase and the orthorhombic crystalline phase. While the tetragonal crystalline phase (or, the tetragonal crystalline grain) and the orthorhombic crystalline phase (or the orthorhombic crystalline grain) stably coexist in the HfZrO film, any one of the tetragonal crystalline phase (or, grain) or the orthorhombic crystalline phase (or, grain) may be present in fractions other than a dominant state.

Within an operating voltage range of the capacitor, the HfZrO film may maintain the intermediate state corresponding to the phase transition region. In an embodiment, in both of a case in which a predetermined operating voltage for charging electric carriers is applied between the first electrode E10 and the second electrodes E20 and a case in which an operating voltage is not applied to the capacitor, the HfZrO film may maintain the intermediate state corresponding to the phase transition region even if the fraction of the tetragonal crystalline phase (crystalline grain) and the orthorhombic crystalline phase (crystalline grain) changes. Accordingly, in an example of the present disclosure, it may be said that while the HfZrO film maintains the intermediate state, charging/discharging operations of the capacitor and related information recording and erasing operations may be implemented.

In an initial state in which a voltage is not applied between the first electrode E10 and the second electrode E20, that is, in an unapplied state, the HfZrO film may have a first intermediate state corresponding to the phase transition region. In a state in which a first operating voltage is applied between the first electrode E10 and the second electrode E20 to charge the capacitor, the HfZrO film may have a second intermediate state also corresponding to the phase transition region. Here, the content of the orthorhombic crystalline phase (crystalline grain) in the second intermediate state may be higher than that of the orthorhombic crystalline phase (crystalline grain) in the first intermediate state. In the first intermediate state, the HfZrO film may contain an orthorhombic crystalline phase (crystalline grain) in an amount of about 10 vol % to about 70 vol %, or about 15 vol % to about 60 vol %, with the remainder being tetragonal phase. In the second intermediate state, a content of the orthorhombic crystalline phase (crystalline grain) of the HfZrO film may be higher than a content of the first intermediate state. For example, in the second intermediate state, the orthorhombic phase may be present in an amount of 70 to 90% or 60 to 90%, with the remainder being tetragonal phase.

After a first operating voltage is applied between the first electrode E10 and the second electrode E20, and then no voltage is applied between the first electrode E10 and the second electrode E20, the HfZrO film may have a remnant polarization substantially corresponding to 0. This means that the HfZrO film does not have the same hysteresis characteristic as that of a ferroelectric material. Since the HfZrO film has the intermediate state, it may not have the same polarization residual characteristics as a ferroelectric material. When the first operating voltage is applied between the first electrode E10 and the second electrode E20 to charge the capacitor, and then the first operating voltage is removed again, or when no voltage is applied between the first electrode E10 and the second electrode E20, the HfZrO film may have the same or substantially the same state as the initial state.

The operating voltage range of the capacitor may be, for example, about −3 V to 3 V. Within this operating voltage range, the HfZrO film may maintain the intermediate state corresponding to the phase transition region. The operating voltage range of the capacitor is designed to be within an operating voltage range of the DRAM to which the capacitor is applied, and thus the operating voltage range of the capacitor may be the same as the operating voltage of the DRAM, or a fraction of the operating voltage of the DRAM.

In an embodiment, the HfZrO film may have a composition represented by $Hf_xZr_{1-x}O_2$, in which $0<x<1$. The $Hf_xZr_{1-x}O_2$ thin film may basically have a high dielectric constant (a dielectric constant of the material itself). In addition, the characteristics of the $Hf_xZr_{1-x}O_2$ thin film may be changed and the dielectric constant may be changed according to its crystallization phase. Particularly, in a phase transition region where tetragonal crystalline grains with anti-ferroelectricity dielectric properties and orthorhombic crystalline grains with ferroelectricity coexist in accordance with examples of the present disclosure, the $Hf_xZr_{1-x}O_2$ thin film may have a large dielectric constant k, and moreover, may have a maximum dielectric constant k. In an example of the present disclosure, the HfZrO film may be made into an intermediate state corresponding to the phase transition region. In addition, when the capacitor is charged or discharged, or when the capacitor as an information recording element of DRAM operates, the high dielectric constant in the phase transition region may be usefully utilized by allocate the two states which may assign "0" or "1" indicating the data storage states within the intermediate states. Therefore, the HfZrO film may have a high dielectric constant k and realize a thin equivalent oxide thickness EOT. These features may be advantageously used for improvement of the operating characteristics of the capacitor, and for improvement and scaling down of the DRAM characteristics The HfZrO film may have, for example, a dielectric constant k of about 50 or more. Also, the HfZrO film may have, for example, an equivalent oxide thickness EOT of about 0.5 nm or less or 0.4 nm or less. Meanwhile, the physical thickness of the HfZrO film may be, for example, within a range of about 1 nm to 10 nm. However, the ranges of dielectric constant, EOT, and physical thickness described above are exemplary, and the embodiments of the present disclosure are not limited thereto.

In one embodiment, the first and second electrodes E10 and E20 may include a conductive metal, a conductive metal compound, or a combination such as a stacked structure in which two or more layers thereof are stacked. The first and second electrodes E10 and E20 may include a conductive metal compound, for example, a conductive nitride or a conductive oxide. In an embodiment, the first and second electrodes E10 and E20 may include TiN or may be formed of TiN. However, this is only exemplary, and the constituent materials of the first and second electrodes E10 and E20 may be variously employed. A known electrode material used in the capacitor may be applied to the first and second electrodes E10 and E20. When the first and second electrodes E10 and E20 include a metal or a metallic material, the capacitor according to the present embodiment may behave as a metal-insulator-metal (MIM) material.

Figure 2:
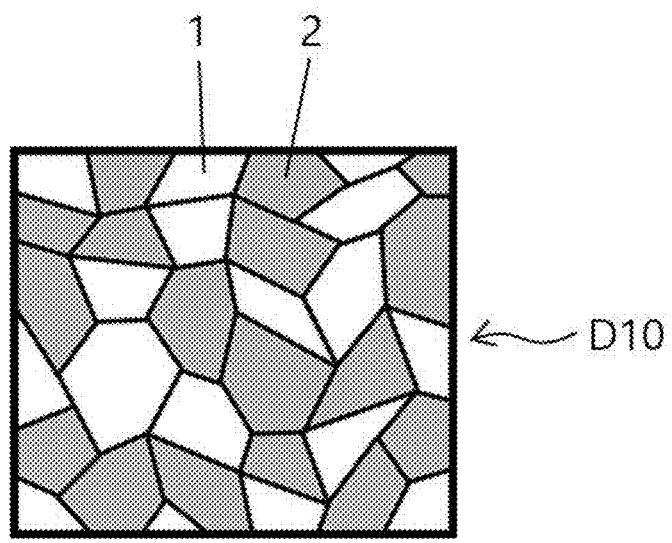
FIG. 2 is a conceptual cross-sectional view illustrating a microstructure of a dielectric layer D10 applied to a capacitor for DRAM according to an example of the present disclosure.

FIG. 2 is a conceptual cross-sectional view illustrating a microstructure of a dielectric layer D10 applied to a capacitor for DRAM according to an example of the present disclosure.

Referring to FIG. 2, the dielectric layer D10 may include an HfZrO film, and the HfZrO film may have an intermediate state corresponding to a phase transition region in which the tetragonal crystalline grain 1 and the orthorhombic crystalline grain 2 coexist. Detailed features of the HfZrO film may be described with reference to FIG. 1, and a repeated description of the features discussed above with respect to FIG. 1 will be omitted.

FIGS. 3A to 3D are cross-sectional diagrams illustrating a method of fabricating a capacitor for DRAM according to an example of the present disclosure.

Figure 3A:
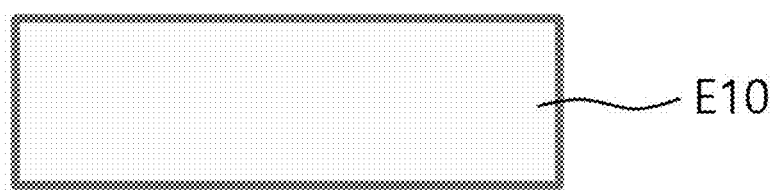
FIGS. 3A to 3D are cross-sectional diagrams illustrating a method of fabricating a capacitor for DRAM according to an example of the present disclosure.
Figure 3B:
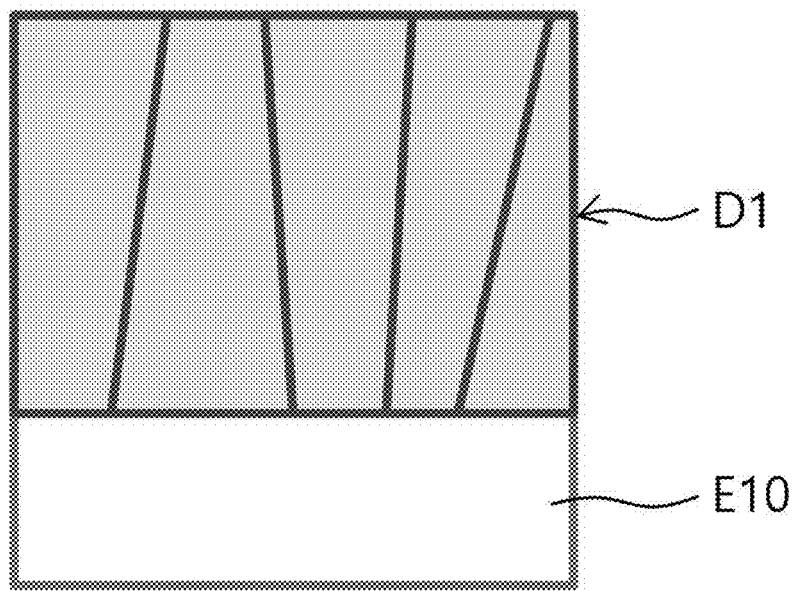

Referring to FIG. 3A, a first electrode E10 may be formed. The first electrode E10 may be a lower electrode. Referring to FIG. 3B, a dielectric layer D1 having an HfZrO film may be formed on the first electrode E10. Here, the HfZrO film of the dielectric layer D1 may have, for example, a first state in which a tetragonal crystalline phase (crystalline grain) is dominant. In this case, the entire HfZrO film may be substantially formed of a tetragonal crystalline phase (crystalline grain).

Figure 3C:
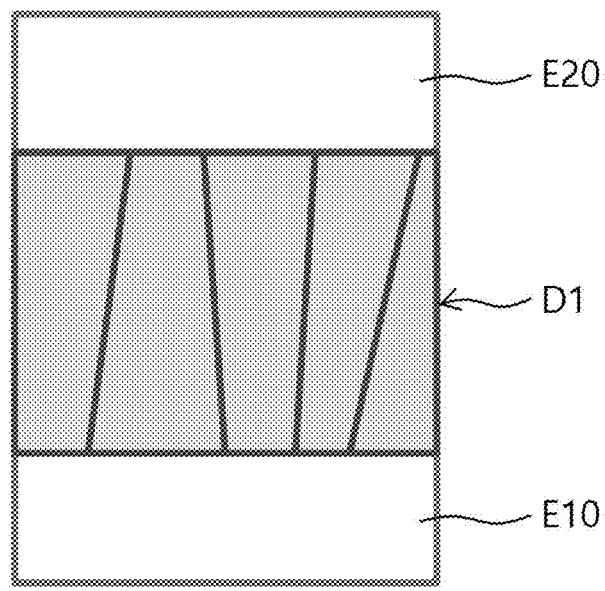

Referring to FIG. 3C, a second electrode E20 may be formed on the dielectric layer D1. The second electrode E20 may be an upper electrode. Although the first electrode E10 and the second electrode E20 illustrate an electrode configuration of the planar capacitor, embodiments of the present disclosure are not limited thereto, and may include an electrode configuration having the above-described three-dimensional shape.

Figure 3D:
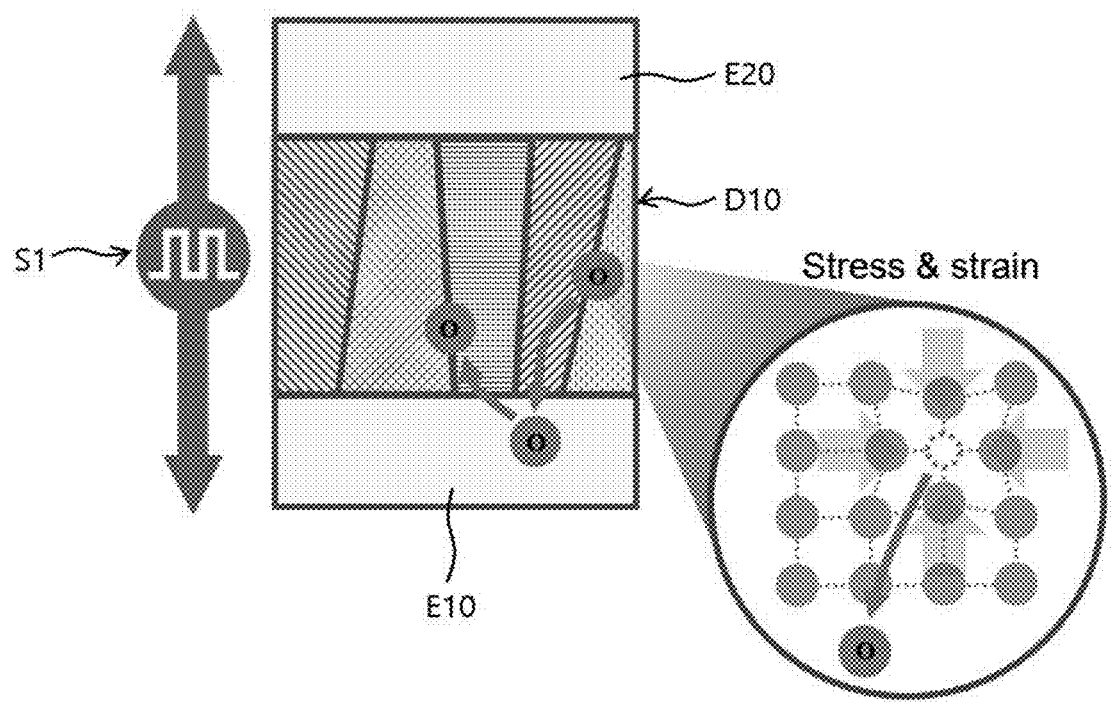

Referring to FIG. 3D, the state of the HfZrO film may be changed into an intermediate state corresponding to a phase transition region between a first state in which a tetragonal crystalline phase with anti-ferroelectricity property is entirely formed or the tetragonal crystalline grain is dominant, and a second state in which an orthorhombic crystalline phase with ferroelectricity property is entirely formed or the orthorhombic crystalline phase is dominant, by repeatedly applying an electric signal between the first and second electrodes E10 and E20. In the intermediate state, as described with reference to FIG. 2, the HfZrO film may include both a tetragonal crystalline phase 1 and an orthorhombic crystalline phase 2. A dielectric layer having the HfZrO film changed to the intermediate state is indicated by reference numeral D10. Within the operating voltage range of the capacitor, the HfZrO film may remain in the intermediate state corresponding to the phase transition region The electric signal S1 may correspond to an electric field strength of about −3 to 3 MV/cm. In embodiments, the electric field strength cycles between −3 and 3 MV/cm, or between a strength of less than −2 and greater than 2 MV/cm within the HfZrO film. In an embodiment, the magnitude of the electric field is up to 3 MV/cm, or greater than 2 MV/cm, regardless of polarity. The electrical signal S1 may be a pulse voltage signal. In an embodiment, the electrical signal S1 may be a pulse voltage signal having a holding time of up to 1,000 μs, and when the electrical signal S1 is repeatedly applied, the interval between the pulse voltage signals may be up to 1,000 μs. When the electrical signal S1 is repeatedly applied, the number of cycles of the electrical signal S1 may be, for example, in a range of about $10^3$ to $10^9$. When these conditions are satisfied, the state of the HfZrO film may be advantageously changed to the intermediate state. However, the specific conditions of the above-described electrical signal S1 are exemplary, embodiments of the present disclosure are not limited thereto. The repeated application of the electrical signal S1 may be referred to as an 'electric cycling' method. The polarity of the electrical signal S1 is not limited, and after the actual capacitor is completed, it may be applied to a capacitor structure fabricated by using an in-chip memory driver circuit for operation, a driver circuit in arithmetic device inside or outside the chip, or a separate setup device connected to the outside of these devices.

In one embodiment, when the electrical signal S1 is repeatedly applied between the first and second electrodes E10 and E20, oxygen vacancies existing at the inner side of the grains of the HfZrO film, the grain interface, the interface between the HfZrO film and the first electrode E10, and the interface between the HfZrO film and the second electrode E20 may repeatedly move in a vertical direction along the electric field. Stress and strain are generated in the HfZrO film by the movement of the oxygen vacancy, and a phase change of the grains of the HfZrO film may be induced by the accumulated stress and strain. Here, the stress may include tensile stress, and in some cases, compressive stress.

As the number of repeated applications of the electrical signal S1 increases, that is, as the number of electrical cycles increases, the amount of change from the anti-ferroelectric tetragonal grains to the ferroelectric orthorhombic grains in the HfZrO film may increase. In the process in which the crystallization phase is changed from the tetragonal system to the orthorhombic system, the phase transition region may be reached, and an effect of increasing the capacitance by the phase transition region may appear. If the number of electric cycles exceeds a predetermined level, the HfZrO film may be changed to a state in which an orthorhombic crystalline phase is dominant, and exhibits ferroelectric properties. This change deviates from the paraelectric behavior according to the examples of the present disclosure, and the capacitance may decrease again. In an example of the present disclosure, it is possible to secure the paraelectric behavior and the highest dielectric constant by enabling the HfZrO film to maintain the intermediate state corresponding to the phase transition region.

As such, in an example of the present disclosure, strain is induced in the HfZrO film through an electric cycling process in the HfZrO film having anti-ferroelectricity, and some crystalline grains having the tetragonal crystal structure are changed into an orthorhombic system having ferroelectricity. As a result, a phase transition region in which two crystallization phases (tetragonal and orthorhombic) coexist is induced, thereby increasing the dielectric constant k and reducing the EOT. In terms of principles and mechanism, the method according to the examples of the present disclosure is distinguished from the conventional wake-up method for strengthening ferroelectricity while reducing a dielectric constant by applying an electrical signal to a general ferroelectric thin film. In addition, in the example of the present disclosure, even if an orthorhombic crystalline phase exists in the HfZrO film, the state in which the residual polarization becomes "0" corresponds to the intermediate state.

In addition, there are advantages that since a method according to embodiments of the present disclosure includes repeatedly applying the electrical signal S1, it is very easy to control, and since it is not a phase change due to the supply of thermal energy, there is no thermal burden that would affect other element parts. In particular, after all the physical components of the DRAM device including the capacitor are manufactured, the state of the HfZrO film may be changed to an intermediate state corresponding to the phase transition region by repeatedly applying the electrical signal S1 to the capacitor as a subsequent process (a final process). Based upon the above procedure, the state of the HfZrO film may be precisely/easily changed, and the intermediate state (a quasi stable state) may be maintained by controlling the magnitude and the number of repetitions of the electrical signal S1.

In addition, embodiments of the present disclosure do not induce a phase change by supply of thermal energy, for example, heat treatment (annealing), but induce a phase change through stress and deformation generated by an electric field. Therefore, since the size of the grains inside the HfZrO film is not increased or not substantially changed, problems such as increase of the grain size and increase of the leakage current due to grain interface growth may be prevented. In changing the state of the HfZrO film to an intermediate state corresponding to the phase transition region, when using the heat treatment method instead of the electrical cycling method, it is practically impossible to change the state of the HfZrO film to the intermediate state or to maintain the intermediate state. In addition, in the conventional approach of the heat treatment as described above, as the grain size of the HfZrO film grows, the grain size increases and the size of grain interfaces grows. As a result, a problem arises that the leakage current increases. In conclusion, since examples of the present disclosure use an electrical cycling method, the size of the grains of the HfZrO film may not increase or the interface may not grow, and increase of leakage current may be prevented by inducing a phase change using a micro-stress caused by the application of the electric field to defects in the thin film.

The operating voltage range of the capacitor may be, for example, about −3 V to 3 V. Within this operating voltage range, the HfZrO film (the HfZrO film included in D10 of FIG. 3D) may maintain an intermediate state corresponding to the phase transition region. The operating voltage range of the capacitor may be within the operating voltage range of the DRAM into which the capacitor is integrated. Accordingly, the operating voltage range of the capacitor may be the operating voltage range of the DRAM, or may a portion of the operating voltage range of the DRAM.

The HfZrO film may have a composition expressed by $Hf_xZr_{1-x}O_2$, in which $0<x<1$. After changing the state of the HfZrO film to the intermediate state, the HfZrO film may have, for example, a dielectric constant k of about 50 or more. In addition, the HfZrO film may have an EOT of, for example, about 0.5 nm or less or 0.4 or less. On the other hand, the physical thickness of the HfZrO layer, for example, may have a range of about 1 nm-10 nm. However, the ranges of the dielectric constant, EOT, and the physical thickness described above are exemplary, and embodiments of the present disclosure are not limited thereto.

According to an example of the present disclosure, the production of the capacitor is completed by changing the state of the HfZrO film to an intermediate state corresponding to the phase transition region at a relatively high voltage by using an electrical cycling method, and thereafter, a capacitor may be operated by using a relatively low operating voltage. During the operation of the capacitor, the HfZrO film may maintain the intermediate state.

Figure 4:
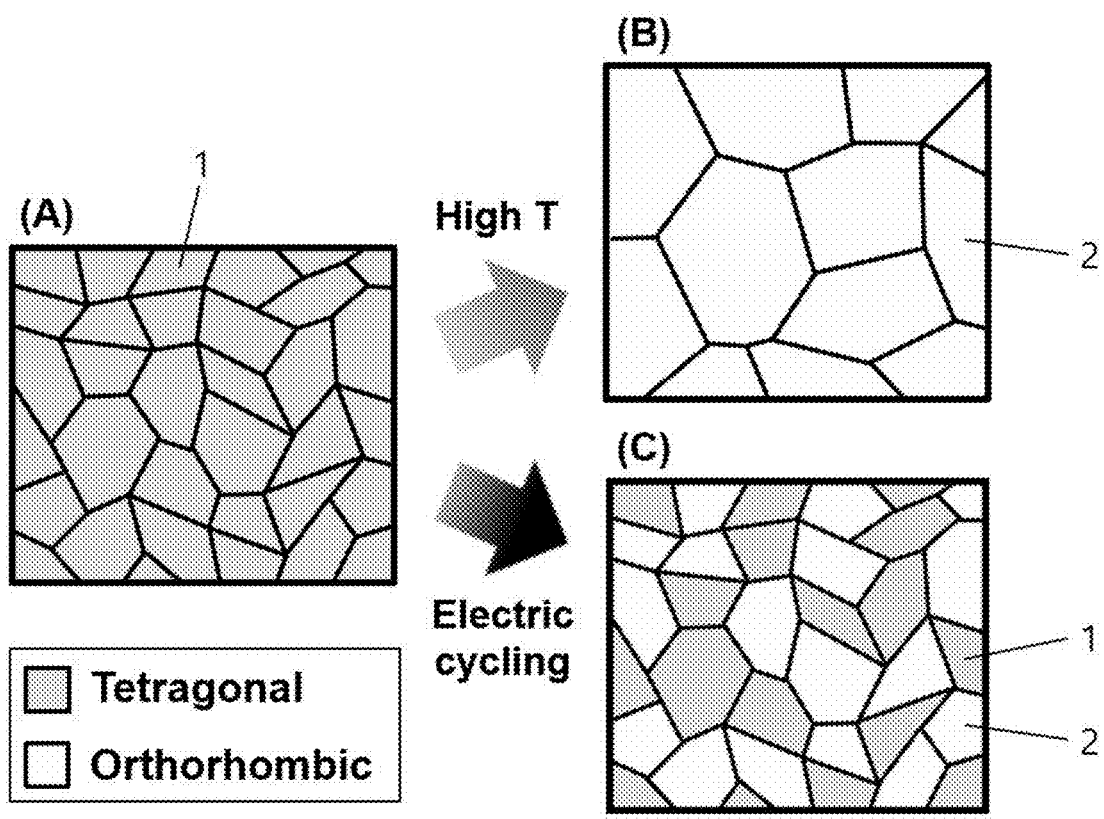
FIG. 4 is a plan view showing a process of changing the state of the HfZrO film having anti-ferroelectricity in two ways.

FIG. 4 is a plan view showing a process of changing the state of the HfZrO film having anti-ferroelectricity in two different ways.

Referring to FIG. 4, as shown in step (A), the initially formed HfZrO film having anti-ferroelectricity may be composed of tetragonal grains 1. If the state of the anti-ferroelectric HfZrO film is changed by a high-temperature heat treatment method, as shown in step (B), an HfZrO film having ferroelectricity may be formed. The ferroelectric HfZrO film may be composed of orthorhombic crystalline grains 2. In this case, the size of the crystalline grains 2 may be increased by the high-temperature heat treatment. On the other hand, when changing the state of the HfZrO film having anti-ferroelectricity by electric cycling according to an embodiment of the present disclosure, as shown in step (C), the HfZrO film may have an intermediate state corresponding to the phase transition region in which the tetragonal grains 1 and orthorhombic grains 2 coexist. When the electrical cycling method is used, the size of the grains 1 and 2 may not change or may not increase.

Figure 5:
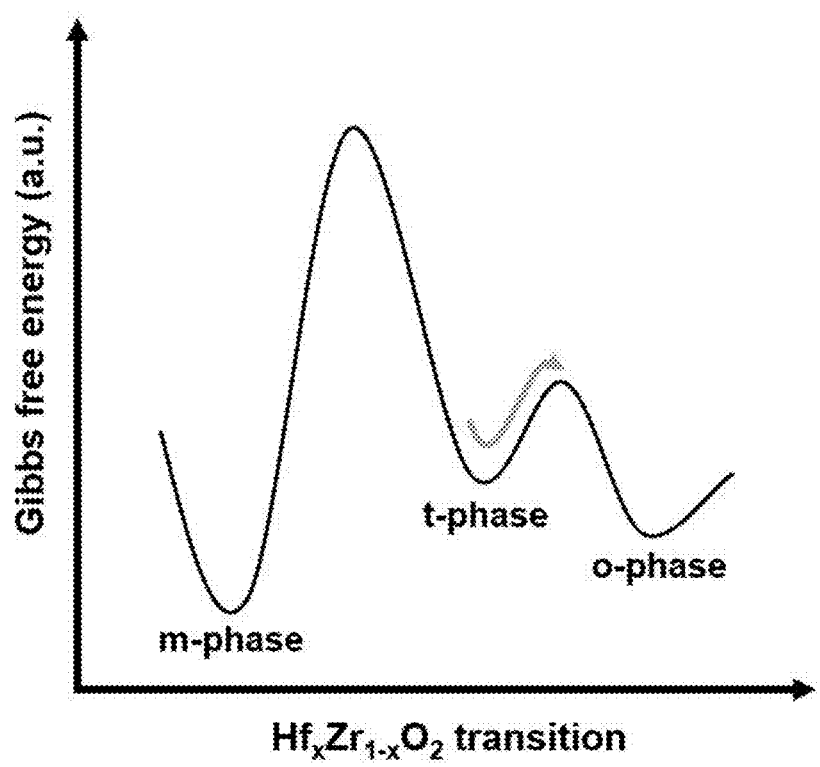
FIG. 5 is a graph showing the change in crystallization phase according to Gibbs free energy of an HfZrO film ($Hf_xZr_{1-x}O_2$ film).

FIG. 5 is a graph showing the change in crystallization phase according to Gibbs free energy of an HfZrO film ($Hf_xZr_{1-x}O_2$ film).

Referring to FIG. 5, m-phase means a monoclinic phase, t-phase means a tetragonal phase, and o-phase means an orthorhombic phase. In an example of the present disclosure, an intermediate state (or an intermediate phase) corresponding to a phase transition region from t-phase to o-phase may be used. An HfZrO film, or $Hf_xZr_{1-x}O_2$ film may be made to have the intermediate state by using an electric cycling method after heat treatment at a predetermined temperature. In addition, the HfZrO film ($Hf_xZr_{1-x}O_2$ film) may be maintained in the intermediate state during the operation of the capacitor including the HfZrO film ($Hf_xZr_{1-x}O_2$ film) and the DRAM within which the capacitor is integrated.

Figure 6:
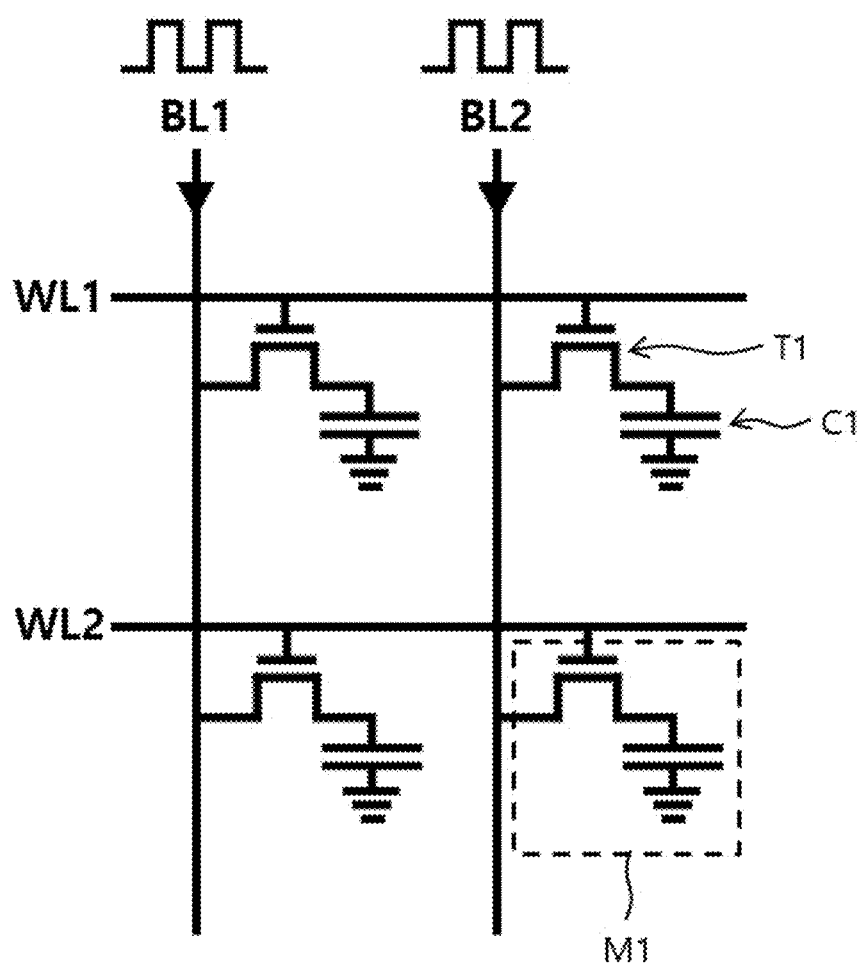
FIG. 6 is a circuit diagram for explaining a method of applying an electric cycling signal to a capacitor on a DRAM circuit.

FIG. 6 is a circuit diagram for explaining a method of applying an electric cycling signal to a capacitor on a DRAM circuit.

Referring to FIG. 6, a plurality of word lines WL1 and WL2 and a plurality of bit lines BL1 and BL2 crossing plurality of word lines WL1 and WL2 may be disposed, and a memory cell M1 may be provided at an intersection point therebetween. A switching element T1 and a capacitor C1 connected thereto may be provided in the memory cell M1. The capacitor C1 may have the capacitor structure according to the example of the present disclosure described with reference to FIG. 1 and the like. However, the DRAM circuit shown here is exemplary, and may be variously modified. In another embodiment, the number of word lines WL1 and WL2 and the number of bit lines BL1 and BL2 is higher than the number shown in FIG. 6.

In an embodiment, all of the plurality of word lines WL1 and WL2 may be turned on, and an electric cycling signal may be applied to the plurality of capacitors C1 through the plurality of bit lines BL1 and BL2. Through this operation, the state of the HfZrO film of the capacitor C1 may be changed to an intermediate state corresponding to the phase transition region. In an embodiment, all of the plurality of word lines WL1 and WL2 are turned on and an electric cycling signal is applied to all of the plurality of bit lines BL1 and BL2. However, in another embodiment, a sequential method may be applied wherein first of all, an electrical cycling signal is applied to the capacitor C1 of the first group (for, example, a first page) included in the first group of memory cells among the plurality of memory cells may be performed. Subsequently, an electrical cycling signal may be applied to capacitor C1 of the second group (for example, a second page) included in the second group of memory cells M1.

Figure 7:
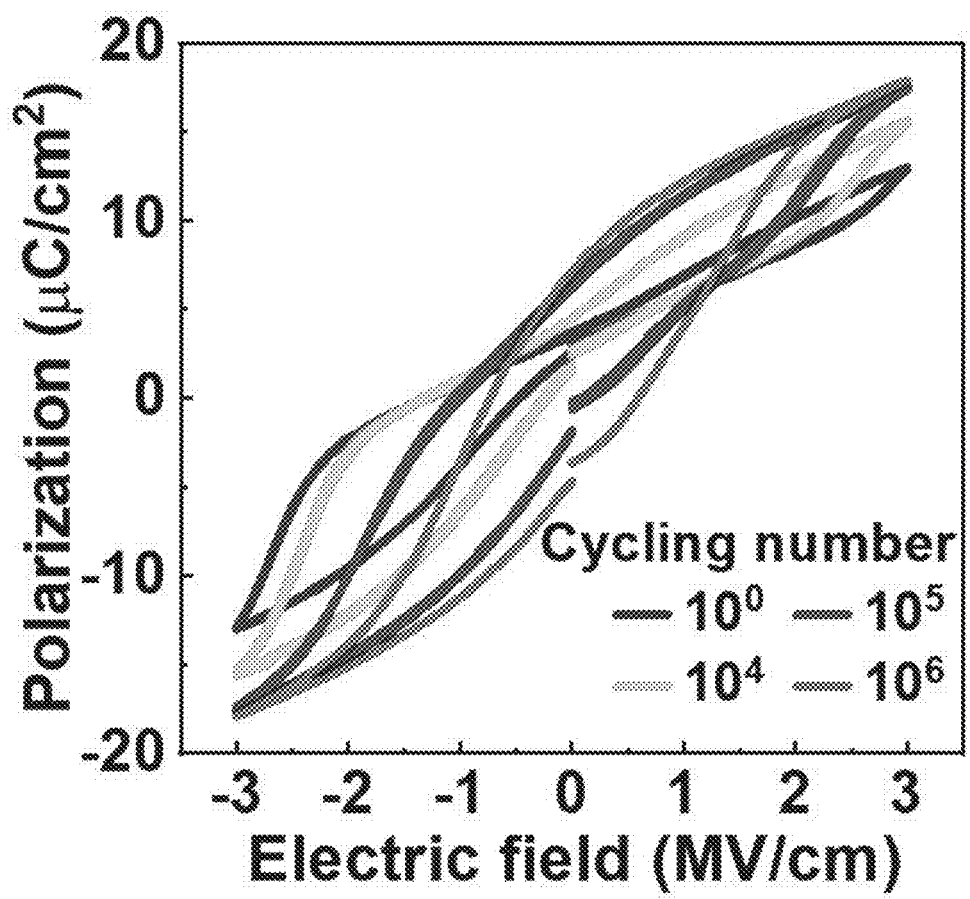
FIG. 7 is a graph showing a change in the polarization-electric field (P-E) characteristics of the HfZrO film according to the number of times when an electric cycling signal is applied to the HfZrO film of a capacitor according to an example of the present disclosure.

FIG. 7 is a graph showing a change in the polarization-electric field (P-E) characteristics of a HfZrO film according to the number of times when an electric cycling signal is applied to the HfZrO film of a capacitor according to an example of the present disclosure. FIG. 7 illustrates a case in which the HfZrO film is a $Hf_{0.25}Zr_{0.75}O_2$ thin film.

Referring to FIG. 7, as the number of applications of an electric cycling signal to the HfZrO film increases, the P-E characteristics of the HfZrO film changes. As the number of electric cycles increases, the amount of the tetragonal grains exhibiting anti-ferroelectricity in the HfZrO film which is changed to orthorhombic grains exhibiting ferroelectricity may increase. In the process in which the crystallization phase is changed from the tetragonal system to the orthorhombic system, the phase transition region may be reached, thereby increasing the capacitance by the phase transition region.

If the number of electric cycles exceeds a certain level, the HfZrO film changes into a state in which an orthorhombic crystalline phase is dominant, exhibits ferroelectric properties, and the capacitance may decrease again. In an example of the present disclosure, the HfZrO film has an intermediate state corresponding to the phase transition region, thereby substantially securing the highest dielectric constant.

Figure 8:
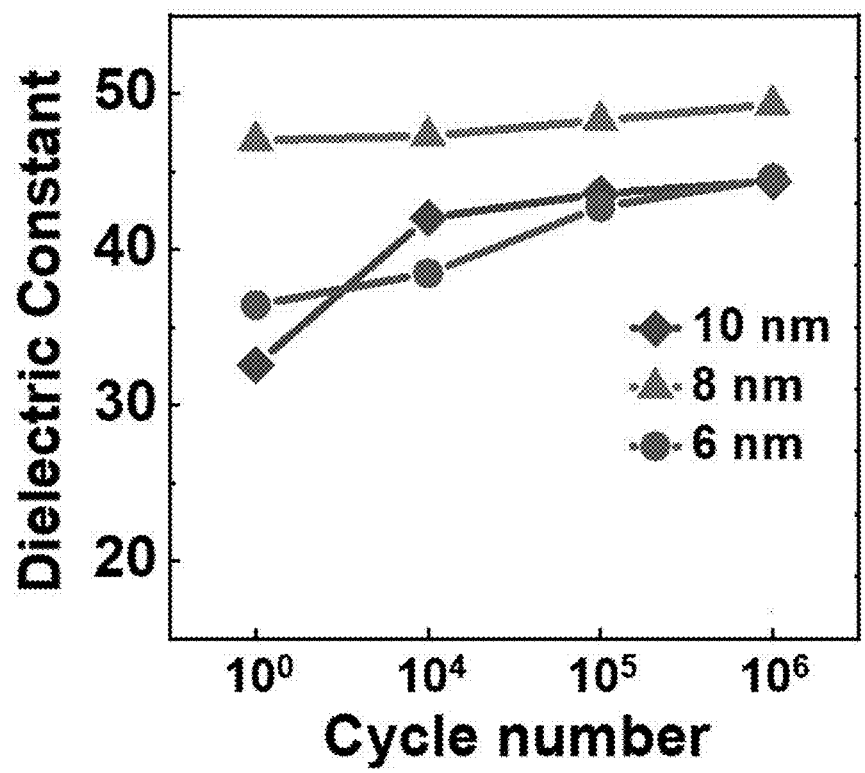
FIG. 8 is a graph illustrating a change in the dielectric constant k of the HfZrO film according to the number of times when an electric cycling signal is applied to the HfZrO film of the capacitor according to an example of the present disclosure.

FIG. 8 is a graph illustrating a change in the dielectric constant k of the HfZrO film according to the number of times that an electric cycling signal is applied to the HfZrO film of the capacitor according to an example of the present disclosure. The graph of FIG. 8 includes results generated when the thickness of the HfZrO film is 6 nm, 8 nm, and 10 nm, as a non-limiting example. FIG. 8 illustrates a case in which the HfZrO film is an $Hf_{0.25}Zr_{0.75}O_2$ thin film.

Referring to FIG. 8, as the number of electric cycles increases within a predetermined range, it may be confirmed that the dielectric constant k of the HfZrO film increases. In addition, it is to be understood that the dielectric constant k tends to increase within a predetermined range regardless of the thickness of the HfZrO film.

Figure 9:
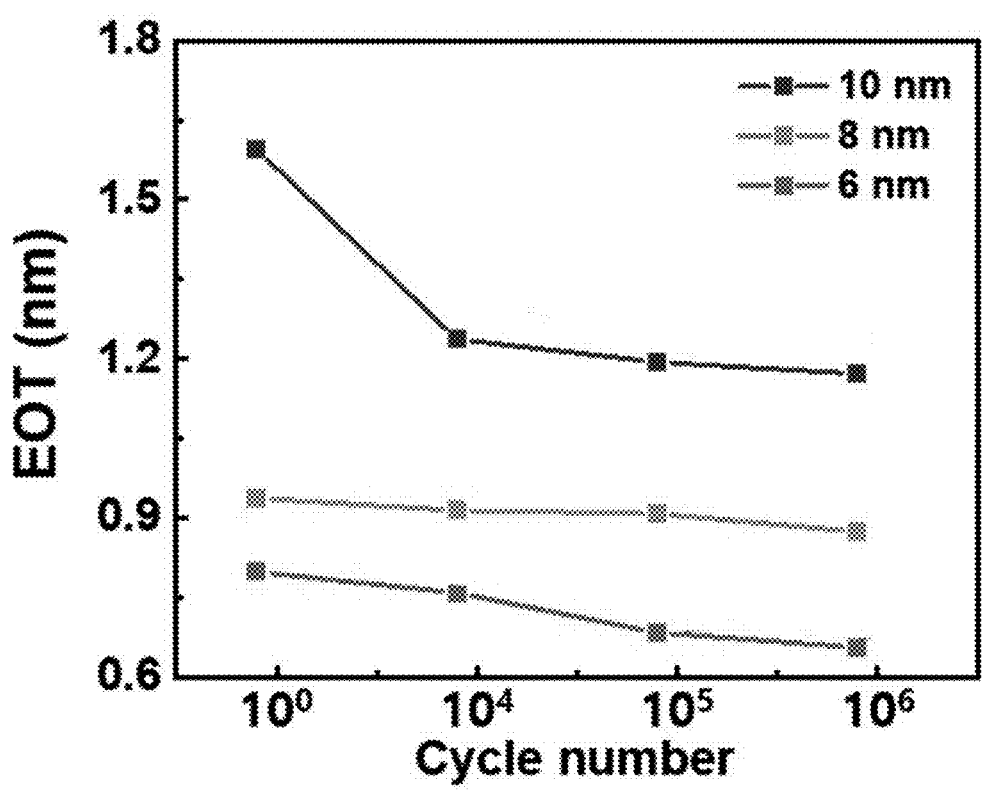
FIG. 9 is a graph showing changes in EOT of the HfZrO film according to the number of times when an electric cycling signal is applied to the HfZrO film of a capacitor according to an example of the present disclosure.

FIG. 9 is a graph showing changes in EOT of the HfZrO film according to the number of times when an electric cycling signal is applied to the HfZrO film of the capacitor according to an example of the present disclosure. The graph of FIG. 9 includes the results generated by embodiments in which the thickness of the HfZrO film is 6 nm, 8 nm, and 10 nm, as a non-limiting example. FIG. 9 illustrates a case in which the HfZrO film is an $Hf_{0.25}Zr_{0.75}O_2$ thin film.

Referring to FIG. 9, as the number of electric cycles increases within a predetermined range, it may be confirmed that the EOT of the HfZrO film decreases. In addition, it was observed that the EOT tends to decrease regardless of the thickness of the HfZrO film within a predetermined range.

Figure 10:
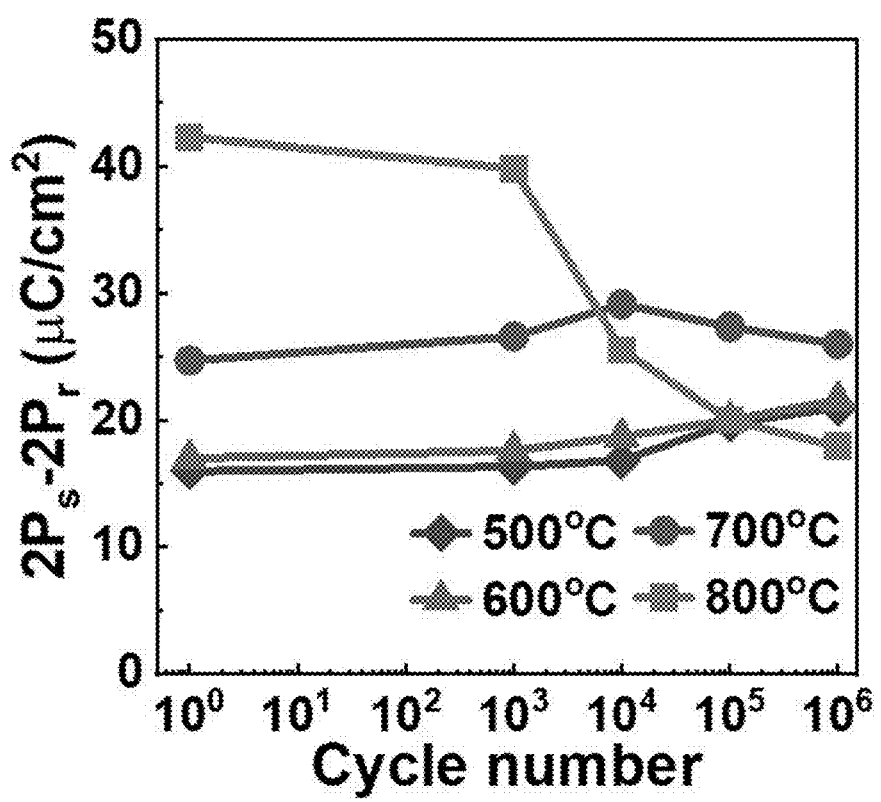
FIG. 10 is a graph showing the difference (i.e., 2Ps-2Pr) change between the saturation polarization and the residual polarization of the HfZrO film according to the electrical cycling and heat treatment temperature of the HfZrO film of the capacitor according to an example of the present disclosure.

FIG. 10 is a graph showing the difference (i.e., 2Ps-2Pr) change between the saturation polarization and the residual polarization of the HfZrO film according to the electrical cycling and heat treatment temperature of the HfZrO film of the capacitor according to an example of the present disclosure. Here, the heat treatment temperature was 500° C., 600° C., 700° C. and 800° C. FIG. 10 illustrates a case in which the HfZrO film is an $Hf_{0.25}Zr_{0.75}O_2$ thin film. When the grains of the thin film have monoclinic crystalline structure, both of the saturation polarization and the residual polarization decrease. Therefore, the value of 2Ps-2Pr decreases, and in the case of a tetragonal system, the saturation polarization increases more than that of a monoclinic system, and the value of 2Ps-2Pr also increases. In the case of the tetragonal and orthorhombic phase transition regions, the saturation polarization greatly increases and the 2Ps-2Pr value reaches its highest level. In the orthorhombic system, as the residual polarization rises to a value similar to that of the saturation polarization, the 2Ps-2Pr value approaches 0 again.

Referring to FIG. 10, it may be confirmed that the crystallinity changes according to the increase in the number of electric cycles for each heat treatment temperature for the HfZrO film. When the heat treatment temperature is as high as 800° C., the crystallinity change from the phase transition region to the orthorhombic system may be relatively large by the increase in the number of electric cycles, resulting in the rapid decrease of the 2Ps-2Pr value.

Figure 11:
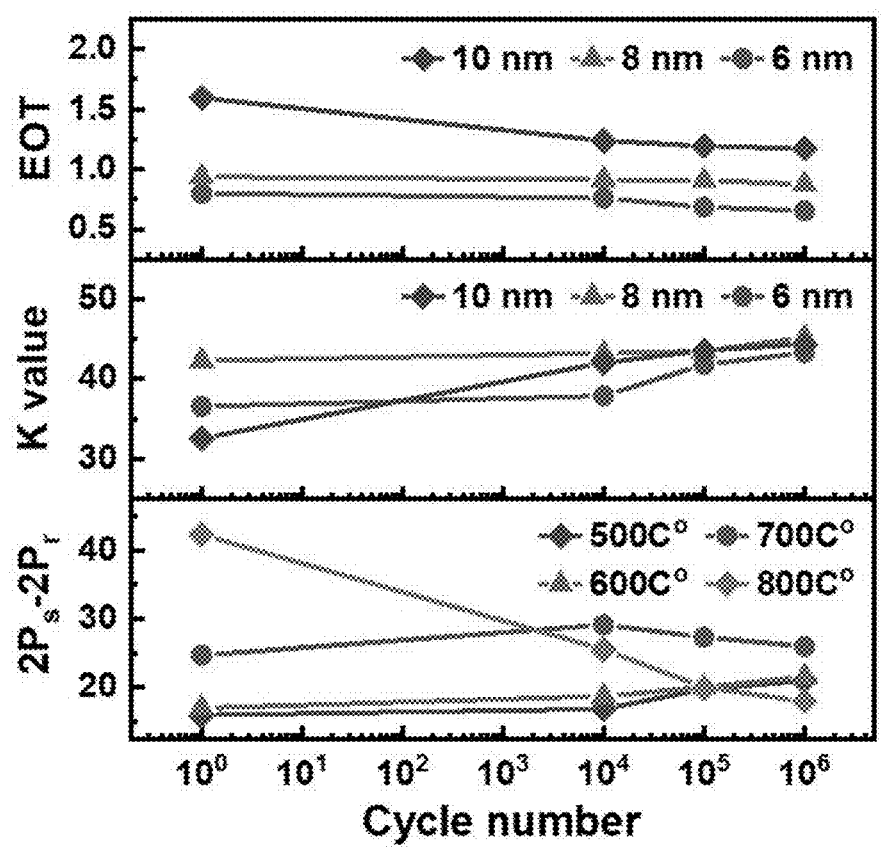
FIG. 11 is a graph in which the results of FIGS. 8 to 10 are integrated into one graph.

FIG. 11 is a graph in which the results of FIGS. 8 to 10 are integrated into one graph. A graph whose vertical axis corresponds to K value (permittivity value) corresponds to the result of FIG. 8, a graph whose vertical axis corresponds to EOT corresponds to the result of FIG. 9, and a graph whose vertical axis corresponds to 2Ps-2Pr corresponds to the result of FIG. 10.

Figure 12:
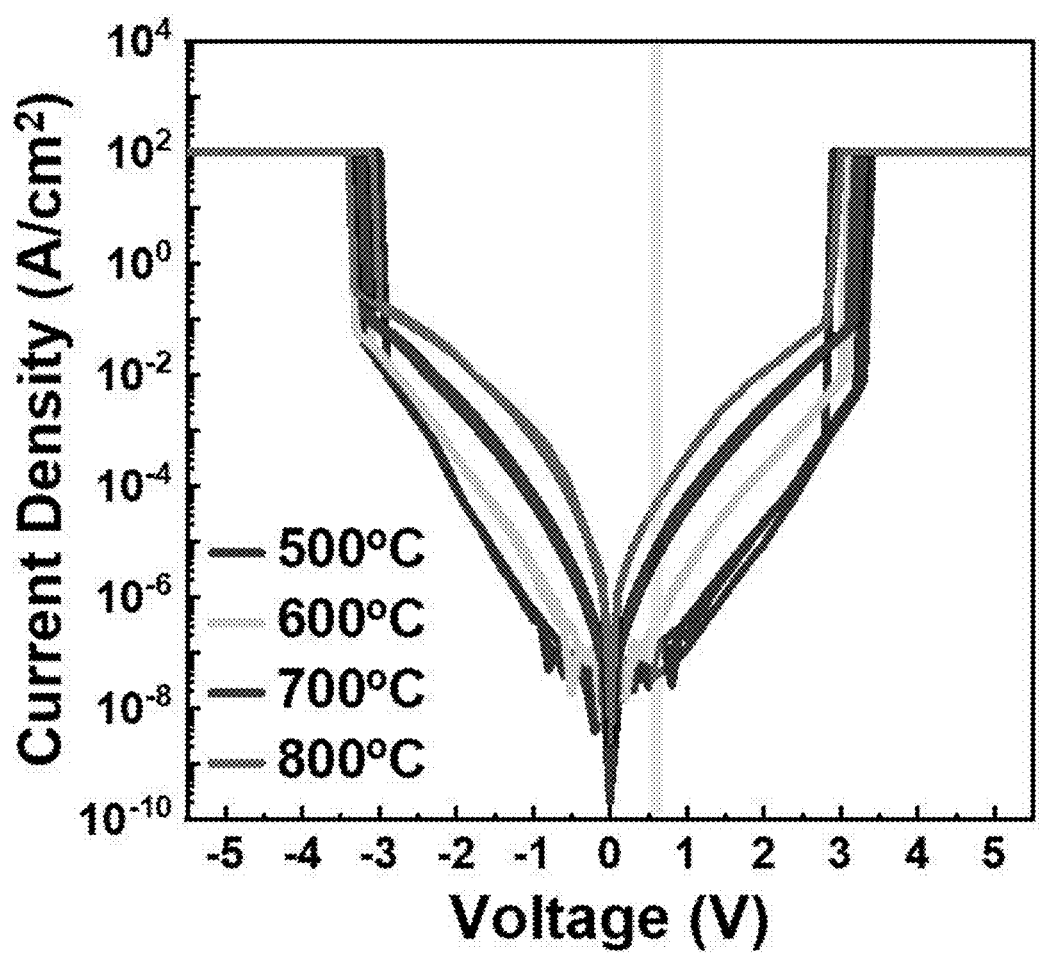
FIG. 12 is a voltage-current density graph showing a change in leakage current characteristics of the HfZrO film according to the heat treatment temperature of the HfZrO film.

FIG. 12 is a voltage-current density graph showing a change in leakage current characteristics of the HfZrO film according to the heat treatment temperature of the HfZrO film. The heat treatment temperature was 500° C., 600° C., 700° C. and 800° C. FIG. 12 illustrates a case in which the HfZrO film is a $Hf_{0.25}Zr_{0.75}O_2$ thin film.

Referring to FIG. 12, as the heat treatment temperature increases, it may be confirmed that the leakage current of the HfZrO film significantly increases. As the heat treatment temperature increases, the grain size of the HfZrO film increases and the grain boundaries grow, the leakage current (tunneling current) of the HfZrO film may increase significantly.

Figure 13:
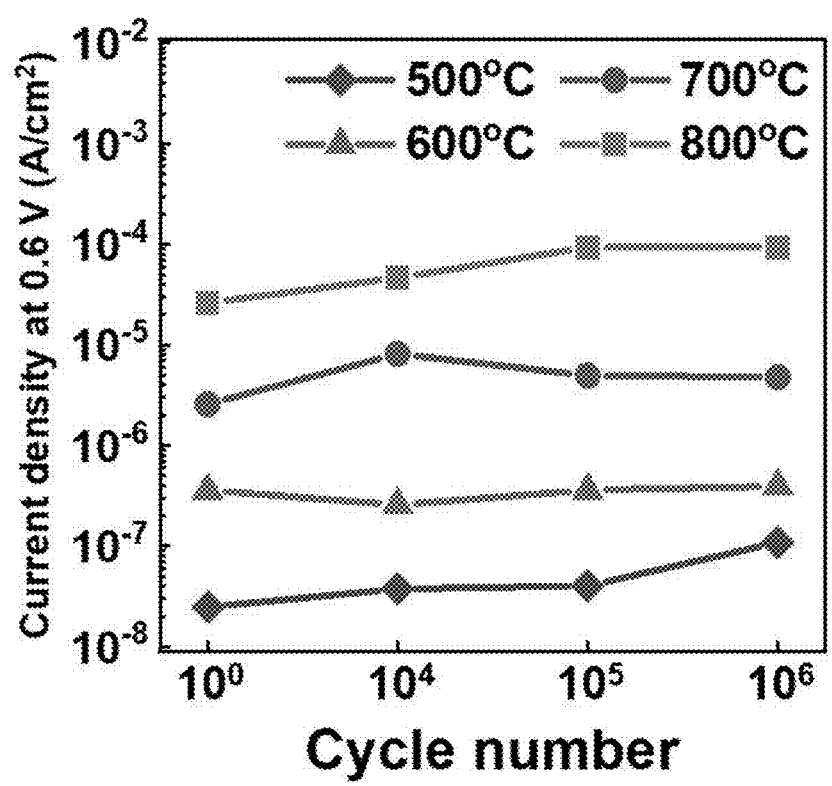
FIG. 13 is a graph showing a change in leakage current characteristics according to an increase in the number of electric cycles for the HfZrO film treated at each heat treatment temperature described in FIG. 12.

FIG. 13 is a graph showing a change in leakage current characteristics according to an increase in the number of electric cycles for the HfZrO film treated at each heat treatment temperature described in FIG. 12. At this time, the strength of the voltage for measuring the current density was 0.6 V. FIG. 13 illustrates a case in which the HfZrO film is an $Hf_{0.25}Zr_{0.75}O_2$ thin film.

Referring to FIG. 13, even if the number of electric cycles for the HfZrO film treated with each heat treatment temperature is increased within a predetermined range, it may be confirmed that the leakage current of the HfZrO film hardly increases or only slightly increases, and at each heat treatment temperature, deterioration of leakage current characteristics due to electric cycling is minimal.

Figure 14:
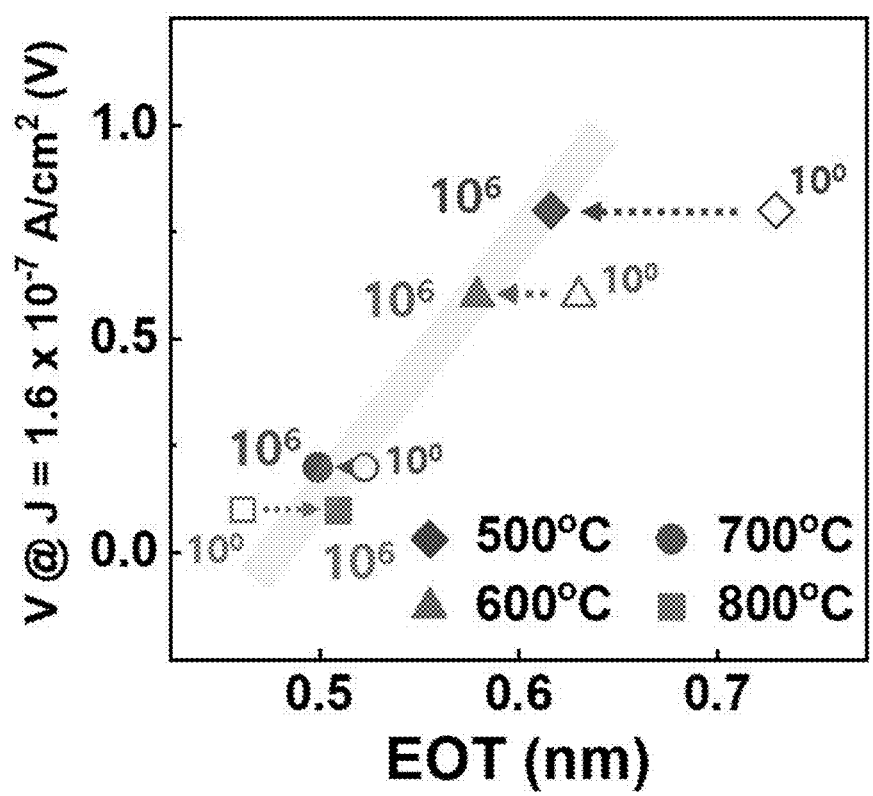
FIG. 14 is a graph showing changes in DRAM allowable voltage (a reference voltage) characteristics compared to EOT according to an increase in the number of electric cycles for the HfZrO film treated at each heat treatment temperature described in FIG. 12.

FIG. 14 is a graph showing changes in DRAM allowable voltage (a reference voltage) characteristics compared to EOT according to an increase in the number of electric cycles for the HfZrO film treated at each heat treatment temperature described in FIG. 12. FIG. 14 illustrates a case in which the HfZrO film is an $Hf_{0.25}Zr_{0.75}O_2$ thin film.

Referring to FIG. 14, even if the number of electric cycles is increased within a predetermined range for the HfZrO film treated with each heat treatment temperature, it may be confirmed that only the EOT is generally reduced, and the DRAM allowable voltage (a reference voltage) characteristics only experience minimal change, so that the original values are substantially maintained.

Figure 15:
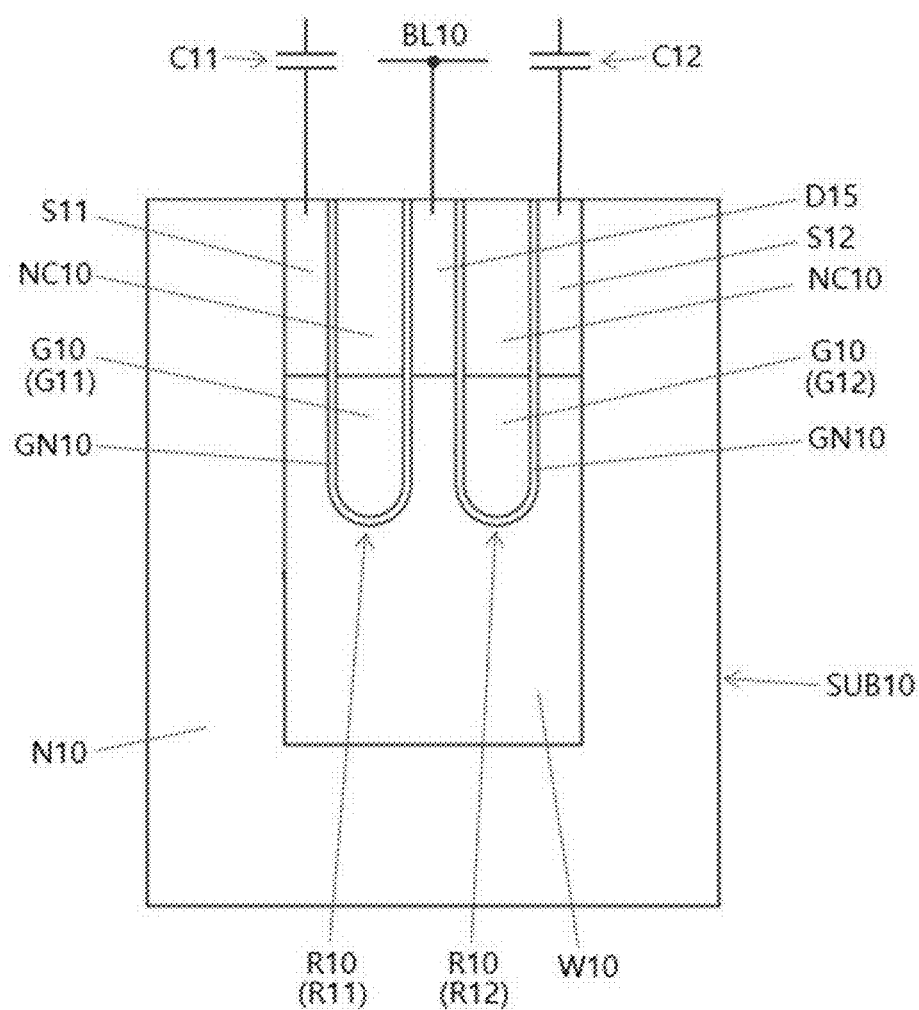
FIG. 15 is a cross-sectional view illustrating a DRAM including a capacitor and a method of fabricating the same according to an example of the present disclosure.

FIG. 15 is a cross-sectional view illustrating a DRAM including a capacitor and a method of fabricating the same according to an example of the present disclosure.

Referring to FIG. 15, a plurality of recess regions R10 may be formed in a substrate SUB10. The plurality of recessed regions R10 may be regions recessed from the top surface of the substrate SUB10. The substrate SUB10 may include an insulating region N10 and a well region W10. The insulating region N10 may be provided to define the well region W10. The well region W10 may be referred to as an active region. The well region W10 may be a semiconductor region doped with a predetermined impurity. For example, the well region W10 may be a region doped with a p-type impurity. In this case, the source/drain regions S11/S12/D15 formed in the well region W10 may be the regions doped with an n-type impurity. Alternatively, the well region W10 may be a region doped with an n-type impurity. In this case, the source/drain regions S11/S12/D15 formed in the well region W10 may be a region doped with a p-type impurity. The well region W10 may include, for example, Si. The insulating region N10 may include, for example, SiO2 or other insulating material. The insulating region N10 may have a shallow trench isolation (STI) structure for device isolation, and the substrate SUB10 may be, as a non-limiting example, a substrate of group IV such as silicon, a silicon/germanium, or a compound substrate of group III-V or II-VI, or may be a semiconductor substrate having a stacked structure such as a silicon-on-insulator (SOI) for suppressing a body effect.

The plurality of recess regions R10 may include, for example, a first recess region R11 and a second recess region R12 spaced apart from each other. The first recessed region R11 and the second recessed region R12 may be inserted into the well region W10. A gate insulating layer GN10 may be formed on the inner surface of the plurality of recessed regions R10, and a gate G10 may be formed on the gate insulating layer GN10 in each of the plurality of recessed regions R10. The gate G10 may be provided to fill the lower region of the recess region R10. The gate G10 may be formed of a predetermined conductive material. The gate G10 may be referred to as a recess gate electrode. The gate G10 disposed in the first recess region R11 may be referred to as a first gate G11, and the gate G10 disposed in the second recess region R12 may be referred to as a second gate G12.

An insulating capping layer NC10 may be formed on the gate G10 in each of the plurality of recess regions R10. The insulating capping layer NC10 may be provided in an upper region of the recess region R10. The source regions S11 and S12 and the drain regions D15 may be formed between the plurality of recess regions R10 and in the substrate SUB10 region on both sides. The source region S11 provided in the substrate SUB10 between the first recess region R11 and the insulating region N10 adjacent thereto may be referred to as a 'first source region', and the source region S12 provided in the substrate SUB10 between the second recess region R12 and the insulating region N10 adjacent thereto may be referred to as a 'second source region'. A drain region D15 may be provided in the substrate SUB10 between the first recess region R11 and the second recess region R12. The source regions S11 and S12 and the drain region D15 may be regions doped with an impurity, that is, an impurity region (a doped region). The source regions S11 and S12 and the drain region D15 may be regions doped with an impurity of a type opposite to that of the well region W10. It may be said that the source regions S11 and S12 and the drain region D15 are formed in the upper layer of the well region W10.

The plurality of gates G10 and the source/drain regions S11/S12/D15 formed on the substrate SUB10 constitute a switching element or may include a switching element. Here, the plurality of gates G10 may be a part of the word line or may be electrically connected to the word line.

A first capacitor C11 electrically connected to the first source region S11, a second capacitor C12 electrically connected to the second source region S12, and a bit line BL10 electrically connected to the drain region D15 may be formed. For convenience, the capacitors C11 and C12 and the bit line BL10 are illustrated for simplicity. The capacitors C11 and C12 may have a capacitor configuration according to an example of the present disclosure. Also, the capacitors C11 and C12 may have various shapes and structures, such as a cylinder shape or a cup shape.

In FIG. 15, a case in which the gate G10 is formed in the recess region R10 is illustrated and described, but this is only an example, and the gate G10 may have a general non-recessed structure. In addition, the configuration of the DRAM device of FIG. 15 may be variously changed.

Figure 16:
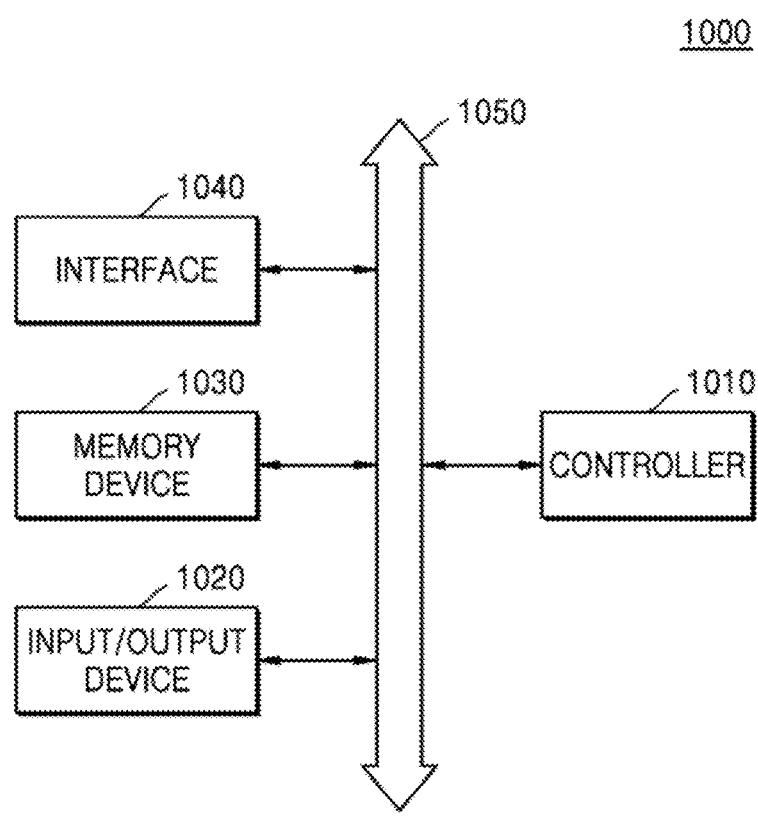
FIG. 16 is a block diagram showing an example of the overall configuration of a system to which a DRAM device manufactured according to an example of the present disclosure is applied.

FIG. 16 is a block diagram showing an example of the overall configuration of a system 1000 to which a DRAM device manufactured according to an example of the present disclosure is applied.

Referring to FIG. 16, a system 1000 may include a controller 1010, an input/output device 1020, a memory device 1030, and an interface 1040. The system 1000 may be a mobile system or a system for transmitting or receiving information. In some embodiments, the mobile system is a personal digital assistant (PDA), a portable computer, a web tablet, a wireless phone, a mobile phone, a digital music player, a memory card, or the like. The controller 1010 controls an executable program in the system 1000, and may be configured by a microprocessor, a digital signal processor, a microcontroller, or a similar device. The input/output device 1020 may be used to input or output data of the system 1000. The system 1000 may be connected to an external device, for example, a personal computer or a network by using the input/output device 1020, and may exchange data with the external device. The input/output device 1020 may be, for example, a keypad, a keyboard, or a display device.

The memory device 1030 may store codes and/or data for the operation of the controller 1010 or may store data processed by the controller 101. The memory device 1030 may include a structure of DRAM manufactured according to embodiments of the present disclosure.

The interface 1040 may be a data transmission path between the system 1000 and another external device. The controller 1010, the input/output device 1020, the memory device 1030, and the interface 1040 may communicate with each other through the bus 1050. The system 1000 may be used in a mobile phone, an MP3 player, a navigation system, a portable multimedia player PMP, a solid state disk SSD, or household appliances. However, the configuration of the system 1000 illustrated in FIG. 16 is merely exemplary and may be changed according to circumstances.

According to the embodiments of the present disclosure described above, it is possible to realize a capacitor for DRAM including a dielectric layer capable of realizing a thin EOT having a high dielectric constant and suppressing or minimizing a leakage current problem. In addition, according to embodiments of the present disclosure, the above-described capacitor for DRAM may be easily manufactured by applying an electrical signal without problems such as deterioration of characteristics. By applying the capacitors according to these embodiments, it is possible to implement a DRAM device having a small memory cell size and excellent operating characteristics.

In the present specification, specific embodiments of the present disclosure have been disclosed, and although specific terms are used, these are only used in a general sense to explain the technical content of the present disclosure and to help the understanding of the present disclosure, and they are not intended to limit the scope of the present disclosure. It will be apparent to those of ordinary skill in the art to which the present disclosure pertains that other modifications based on the technical spirit of the present disclosure may be implemented in addition to the embodiments disclosed herein. It will be understood by those of ordinary skill in the related art that various substitutions, changes and modifications may be made in connection with a capacitor for DRAM according to the embodiment described with reference to FIGS. 1 to 16, a DRAM including the same, and a method of fabricating the same. Therefore, the scope of the claims should not be determined by the described embodiments, but should be determined by the technical concepts described in the claims.

EXPLANATION OF SYMBOLS

1: tetragonal grains
2: orthorhombic grains
BL1, BL2, BL10: bit lines
C1, C11, C12: capacitor
D1, D10: dielectric layer
D15: drain region
E10: first electrode
E20: second electrode
G10: gate
GN10: gate insulating layer
N10: insulating region
NC10: insulating capping layer
R10: recess region
SUB10: substrate
T1: switching element
W10: well region
WL1, WL2: word line

What is claimed is:

1. A capacitor for DRAM (dynamic random access memory) comprising:
a first electrode;
a second electrode spaced apart from the first electrode; and
a dielectric layer including a hafnium-zirconium oxide (HfZrO) film disposed between the first electrode and the second electrode,
wherein the HfZrO film has an intermediate state corresponding to a phase transition region between a first state in which tetragonal crystalline phase is dominant and a second state in which orthorhombic crystalline phase is dominant, and
wherein the HfZrO film maintains the intermediate state corresponding to the phase transition region within an operating voltage range of the capacitor,
wherein in an initial state in which no voltage is applied between the first electrode and the second electrode, the HfZrO film has a first intermediate state corresponding to the phase transition region,
wherein, when a first operating voltage is applied between the first electrode and the second electrode to charge the capacitor, the HfZrO film has a second intermediate state corresponding to the phase transition region, and
wherein the content of the orthorhombic crystalline phase of the second intermediate state is higher than that of the orthorhombic crystalline phase of the first intermediate state.

2. The capacitor for DRAM of claim 1, wherein after a first operating voltage larger than 0 V is applied between the first electrode and the second electrode, and when a voltage of 0 V is applied between the first electrode and the second electrode, the HfZrO film has a remnant polarization of about 0.

3. The capacitor for DRAM of claim 1, wherein the operating voltage range of the capacitor is about −3 V to 3 V.

4. The capacitor for DRAM of claim 1, wherein the HfZrO film has a composition of $Hf_xZr_{1-x}O_2$, in which $0<x<1$.

5. The capacitor for DRAM of claim 1, wherein the HfZrO film has a thickness of about 1 nm to 10 nm.

6. A DRAM comprising the capacitor according to claim 1.

7. The capacitor for DRAM of claim 1, wherein the tetragonal crystalline phase has an anti-ferroelectric property and the orthorhombic crystalline phase has a ferroelectric property.

8. A capacitor for DRAM (dynamic random access memory) comprising:
 a first electrode;
 a second electrode spaced apart from the first electrode; and
 a dielectric layer including a hafnium-zirconium oxide (HfZrO) film disposed between the first electrode and the second electrode,
 wherein the HfZrO film has an intermediate state corresponding to a phase transition region between a first state in which tetragonal crystalline phase is dominant and a second state in which orthorhombic crystalline phase is dominant,
 wherein the HfZrO film maintains the intermediate state corresponding to the phase transition region within an operating voltage range of the capacitor,
 wherein the HfZrO film has a dielectric constant of about 50 or more, and
 wherein the HfZrO film has an equivalent oxide thickness (EOT) of 0.5 nm or less.

9. A method of fabricating a capacitor for DRAM, the method comprising:
 forming a first electrode;
 forming a dielectric layer having an HfZrO film on the first electrode;
 forming a second electrode on the dielectric layer; and
 changing the HfZrO film into an intermediate state corresponding to a phase transition region between a first state in which a tetragonal crystalline phase is dominant and a second state in which an orthorhombic crystalline phase is dominant, by repeatedly applying an electrical signal between the first and second electrodes,
 wherein the HfZrO film maintains the intermediate state corresponding to the phase transition region within an operating voltage range of the capacitor.

10. The method of fabricating a capacitor for DRAM of claim 9, wherein the electrical signal creates an electric field having a strength of about −3 MV/cm to 3 MV/cm.

11. The method of fabricating a capacitor for DRAM of claim 9, wherein the electrical signal is a pulse voltage signal having a duration time of 1,000 μs or less, and
 wherein an interval between the pulse voltage signals is 1,000 μs or less.

12. The method of fabricating a capacitor for DRAM of claim 9, wherein repeatedly applying the electrical signal includes applying the electrical signal for $10^3$ to $10^9$ cycles.

13. The method of fabricating a capacitor for DRAM of claim 9, wherein the operating voltage range of the capacitor is in the range of about −3 V to 3 V.

14. The method of fabricating a capacitor for DRAM of claim 9, wherein the HfZrO film has a composition of $Hf_xZr_{1-x}O_2$, in which $0<x<1$.

15. The method of fabricating a capacitor for DRAM of claim 9, wherein the HfZrO film has a thickness in the range of about 1 nm to 10 nm.

16. The method of fabricating a capacitor for DRAM of claim 9, wherein after changing the state of the HfZrO film into the intermediate state, the HfZrO film has a dielectric constant of about 50 or more, and the HfZrO film has an equivalent oxide thickness (EOT) of about 0.4 nm or less.

17. The method of fabricating a capacitor for DRAM of claim 9, wherein the tetragonal crystalline phase has an anti-ferroelectric property and the orthorhombic crystalline phase has a ferroelectric property.

18. A method of fabricating a DRAM including a switching element and a capacitor electrically connected to the switching element, the method comprising fabricating the capacitor by the method of claim 9.

\* \* \* \* \*